(12) United States Patent
Bolam et al.

(10) Patent No.: US 6,492,684 B2
(45) Date of Patent: Dec. 10, 2002

(54) SILICON-ON-INSULATOR CHIP HAVING AN ISOLATION BARRIER FOR RELIABILITY

(75) Inventors: Ronald J. Bolam, Fairfield, VT (US); Subhash B. Kulkarni, Cortlandt Manor, NY (US); Dominic J. Schepis, Wappinger Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/878,681

(22) Filed: Jun. 11, 2001

(65) Prior Publication Data

US 2002/0043686 A1 Apr. 18, 2002

Related U.S. Application Data

(60) Continuation-in-part of application No. 09/859,146, filed on May 16, 2001, which is a continuation of application No. 09/148,918, filed on Sep. 4, 1998, now Pat. No. 6,281,095, which is a division of application No. 09/009,445, filed on Jan. 20, 1998, now Pat. No. 6,133,610.

(51) Int. Cl.[7] .............................................. H01L 29/01
(52) U.S. Cl. ..................... 257/349; 257/347; 257/350; 257/352; 257/353; 257/355; 257/374; 257/375; 257/376
(58) Field of Search ................................ 257/347–355, 257/374–376

(56) References Cited

U.S. PATENT DOCUMENTS

| 4,567,646 A | 2/1986 | Ishikawa et al. |
| 4,656,730 A | 4/1987 | Lynch et al. |
| 4,784,970 A | 11/1988 | Solomon |
| 5,091,331 A | 2/1992 | Delagdo et al. |
| 5,096,848 A | 3/1992 | Kawamura |
| 5,162,254 A | 11/1992 | Usui et al. |
| 5,366,923 A | 11/1994 | Beyer et al. |
| 5,498,893 A | 3/1996 | Usui et al. |
| 5,504,033 A | 4/1996 | Bajor et al. |
| 5,517,047 A | 5/1996 | Linn et al. |
| 5,811,315 A | 9/1998 | Yindeepol et al. |
| 6,091,129 A | 7/2000 | Cleeves |
| 6,097,056 A | 8/2000 | Hsu et al. |
| 6,133,610 A | * 10/2000 | Bolam et al. |

FOREIGN PATENT DOCUMENTS

JP          6177242 A     6/1994

* cited by examiner

*Primary Examiner*—Fetsum Abraham
(74) *Attorney, Agent, or Firm*—Ratner & Prestia; Joseph P. Abate

(57) ABSTRACT

An SOI chip having an isolation barrier. The SOI chip includes a substrate, an oxide layer deposited on the substrate, and a silicon layer deposited on the oxide layer. A gate is deposited above the silicon layer. A first metal contact is deposited above the gate to form an electrical contact with the gate. Second and third metal contacts are deposited to form electrical contacts with the silicon layer. The isolation barrier extends through the silicon layer and the oxide layer, and partially into the substrate, to block impurities in the oxide layer outside the isolation barrier from diffusing into the oxide layer inside the isolation barrier. The isolation barrier surrounds the gate, the first metal contact, the second metal contact, and the third metal contact—which define an active chip area inside the isolation barrier. A method of manufacturing the SOI chip is also disclosed.

38 Claims, 16 Drawing Sheets

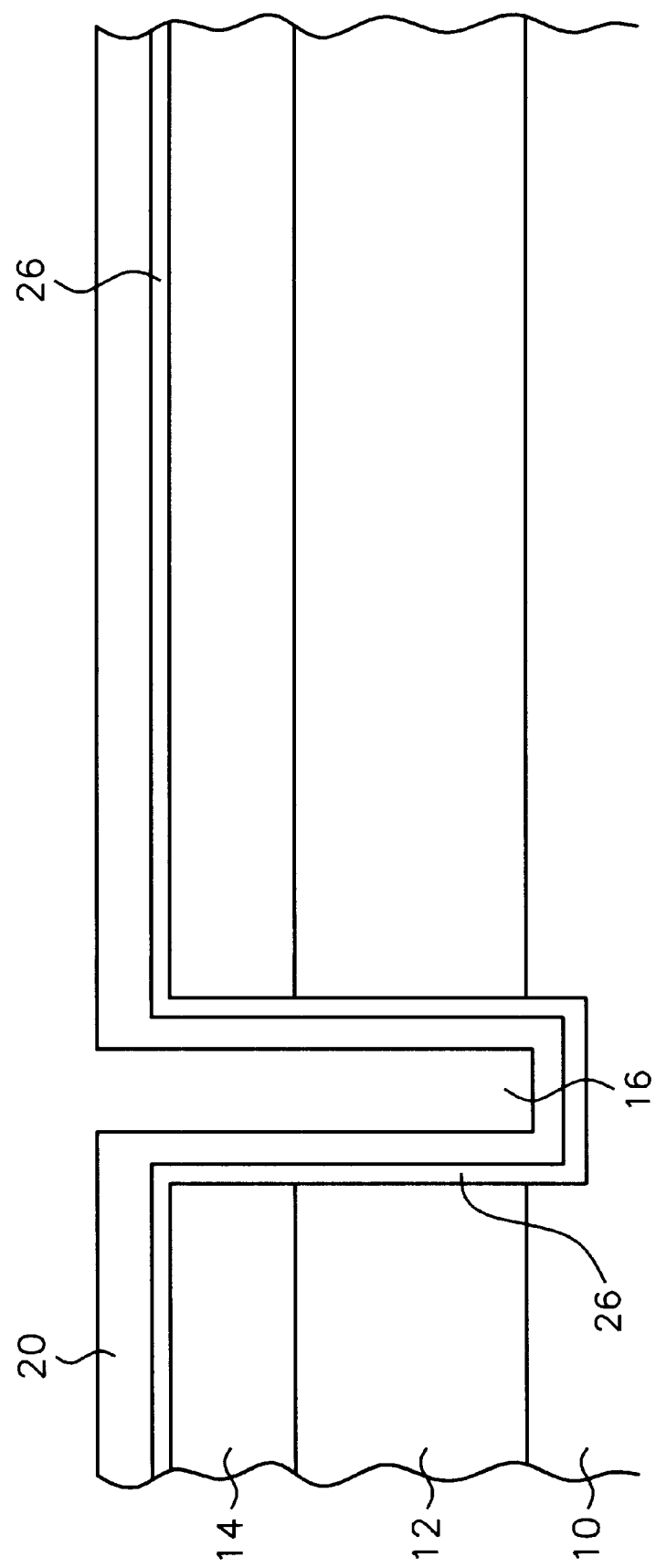

SILICON-ON-INSULATOR CHIP HAVING AN ISOLATION BARRIER FOR RELIABILITY

CROSS-REFERENCE TO RELATED APPLICATIONS

This application is a continuation-in-part of U.S. patent application Ser. No. 09/859,146, filed on May 16, 2001 (pending), which is a continuation of U.S. patent application Ser. No. 09/148,918, filed on Sep. 4, 1998 (allowed), U.S. Pat. No. 6,281,095 which is a divisional of U.S. patent application Ser. No. 09/009,445; filed on Jan. 20, 1998, now U.S. Pat. No. 6,133,610.

FIELD OF THE INVENTION

The present invention relates generally to a silicon-on-insulator (SOI) chip and, more particularly, to an SOI chip having an isolation barrier to prevent the diffusion of impurities into active regions of the chip.

BACKGROUND

As the scale of integration increases in the manufacture of integrated circuits, devices become smaller and more sensitive to impurities. During the packaging of a semiconductor chip, impurities from the packaging environment can enter the chip, diffuse into silicon junctions, and compromise the reliability and performance of the integrated circuit. Semiconductor manufacturers have known this for some time and invest in manufacturing equipment to minimize the introduction of impurities during integrated circuit manufacturing.

Typical impurities include mobile ions such as Na, Fe, or other diffusing species. One conventional process of providing a barrier preventing these impurities from entering the chip includes coating the chip with a passivation layer around the outside and top of the chip. Typical materials used as a passivation layer include silicon nitride or metal levels formed during the chip wiring. Such a barrier works for conventional semiconductor chips which do not have a buried oxide layer (or BOX).

A BOX is endemic to the silicon-on-insulator (SOI) chip structure and represents a path for the migration of impurities if exposed. Indeed, this path is laid open to just such exposure when the individual chips are diced from the wafer before packaging. A conventional SOI chip 1, illustrated in FIG. 1, includes a silicon substrate 10 and an oxide layer 12 deposited above substrate 10. A silicon layer 14 is deposited above oxide layer 12. Silicon layer 14 includes at least one shallow trench 34 extending through silicon layer 14 to electrically separate active regions within silicon layer 14 from one another. These active regions typically include transistors formed in silicon layer 14. Trenches 34 are typically filled with an insulative oxide material.

A gate 18 is deposited above silicon layer 14. A passivation layer 26 is deposited above silicon layer 14 and around gate 18. A barrier material 20 is deposited above passivation layer 26. Barrier material 20 is typically a dielectric material such as phosphosilicate glass (PSG), BPSG, nitride, or other similar material. Gate metal contact 30 is deposited above gate 18, as illustrated in FIG. 1, such that gate metal contact 30 extends from the top of SOI chip 1 through barrier material 20 and passivation layer 26 to form an electrical contact with gate 18. Second and third metal contacts 40 are then deposited above silicon layer 14, as illustrated in FIG. 1, such that metal contacts 40 extend from the top of SOI chip 1 through barrier material 20 and passivation layer 26 to form electrical contacts with selected areas of silicon layer 14.

Unlike other types of semiconductor chips, an SOI chip 1 is not adequately protected from impurities by merely coating the outside and top of the SOI chip 1 with a passivation layer 26. This is because SOI chips 1 are manufactured by dicing, which causes SOI chips 1 to have diced edges, such that edges 42 of oxide layer 12 buried within the SOI chip 1 are exposed to the outside environment. The exposed edges 42 act as an entryway for impurities notwithstanding coating of the outside and top of the SOI chip 1 with a passivation layer 26. Once inside oxide layer 12, the impurities may diffuse into various regions of the SOI chip 1.

The SOI chip 1 is particularly sensitive to contamination from these impurities after chip dicing but before packaging. Contamination at this particular juncture of the manufacturing process can result in loss of manufacturing yield. Accordingly, there is a need for an additional barrier to impurities diffusing into the SOI chip 1 from along the edges 42 of oxide layer 12.

A process of passivating SOI chips 1 to prevent contamination by mobile ions before chip packaging has been described by K. Motonori in Japanese Published Patent Document No. 6-177242. Montonori describes a device in which an ion diffusion barrier is deposited alongside a silicon-buried oxide layer to protect this layer from mobile ion contamination. This device, although it protects the exposed edges of the chip and may fulfill the desired function, has several significant drawbacks.

The process of exposing the edges of SOI chips before dicing involves several potentially defect-producing steps which may reduce the overall manufacturing yield of the integrated circuits. First, the process described by Motonori, for passivating the edges of the SOI integrated circuits, requires two photolithography steps and two etching steps involving reactive ion etching. The etching steps consist of etching through many insulator films, a total thickness of well over 10,000 angstroms, and exposing the completed integrated circuit to charging damage due to the long duration of the reactive ion etching plasma steps.

Second, Motonori describes a process by which the diffusion barrier is removed from the chip dicing area just before dicing, which requires a second photolithography step and alignment to the regions to be removed. The addition of this step increases the size of the dicing region, leaving less area on each wafer for integrated circuits. This leads to larger "footprint" or die sizes. Larger die sizes often decrease the amount of chips available per wafer, causing manufacturing cost to increase.

Finally, the conformality, or ability to deposit a uniform film of the ion diffusion barrier on a vertical surface over 10,000 angstroms deep, is critical to the effectiveness of the barrier. Any break in the film would risk contamination of the final chip by mobile ions.

To overcome the shortcomings of conventional SOI chips, a new SOI chip is provided. An object of the present invention is to provide a mobile ion barrier between the edges of the exposed SOI integrated circuit and the integrated circuits within the exposed SOI integrated circuit. A related object is to provide an integrated diffusion barrier within the SOI chip itself, having a shallow depth, minimal lateral dimensions, and a planar surface. It is another object of the invention to provide an isolation groove structure as the integrated diffusion barrier and to fill the isolation groove with films that are part of the existing semiconductor fabrication sequence. It is a further object of the invention to provide an integrated diffusion barrier, within the integrated circuit area, which does not require additional area in the dicing channels for either a barrier layer or any photolithography steps which would increase the size of the integrated circuit area.

To also overcome the shortcomings of conventional processes of manufacturing SOI chips, a new process of manufacture is provided. An object of the present invention is to reduce processing steps. A related object is to manufacture an integrated diffusion barrier using a single photolithography mask and a single reactive ion step. Another object is to subject the integrated circuit to less charging due to reduced exposure to reactive ion etching.

SUMMARY OF THE INVENTION

To achieve these and other objects, and in view of its purposes, the present invention provides an SOI chip including a substrate, a buried oxide layer deposited above the substrate, and a silicon layer deposited above the oxide layer. A gate oxide layer is deposited above the silicon layer. A gate is deposited above the gate oxide layer. A gate metal contact is deposited above the gate to form an electrical contact with the gate. Second and third metal contacts are deposited to form electrical contacts with the silicon layer. The SOI chip has an isolation barrier extending through the silicon layer and the buried oxide layer to prevent diffusion of impurities into the buried oxide layer. The isolation barrier surrounds the gate, the first metal contact, the second metal contact, and the third metal contact, to define an active chip area inside the isolation barrier.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures:

FIGS. 5A, 5B and 5C are side views of SOI chips having isolation barriers according to the present invention;

DETAILED DESCRIPTION

Figure 1:
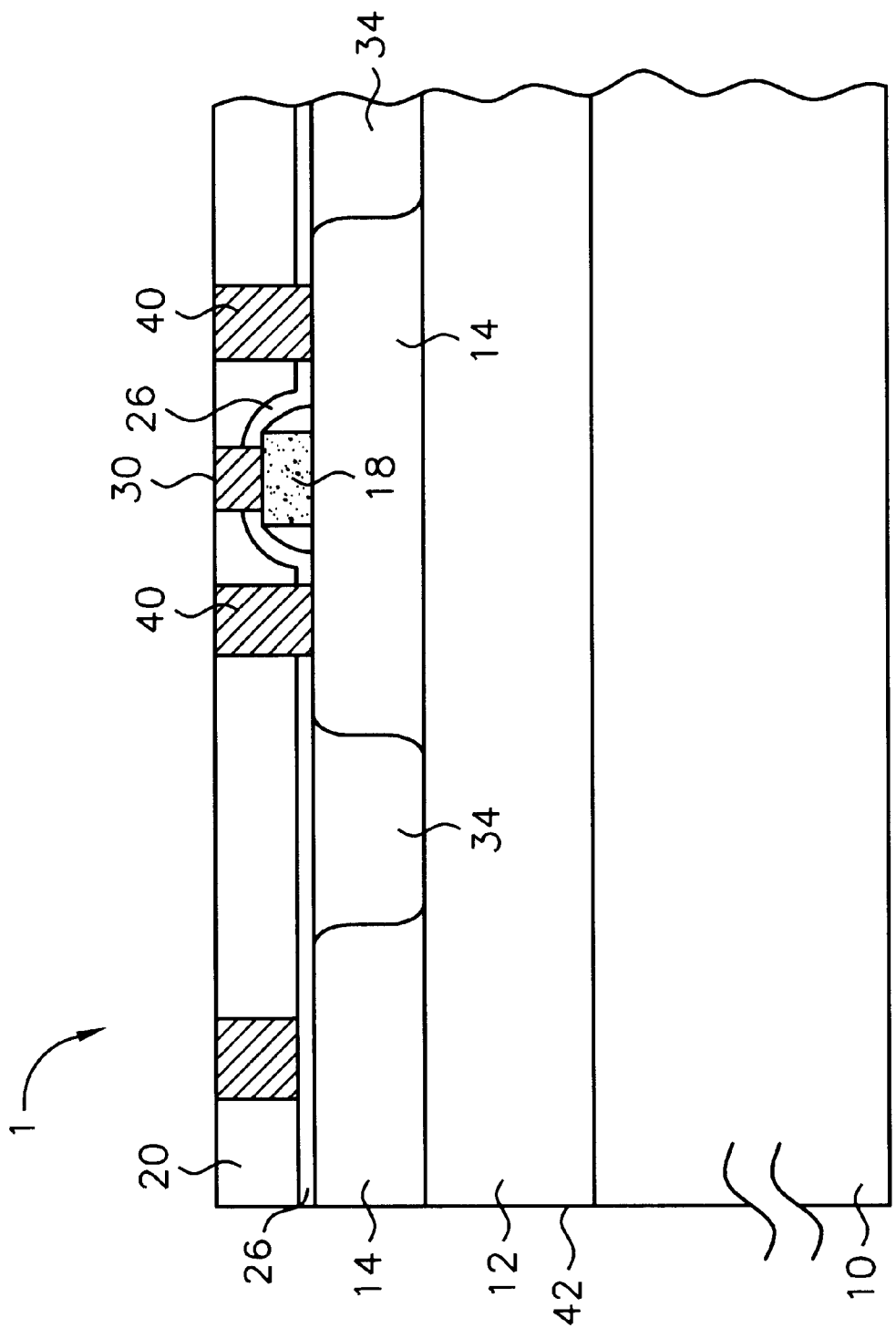
FIG. 1 is a side view of a conventional SOI chip.
Figure 2A:
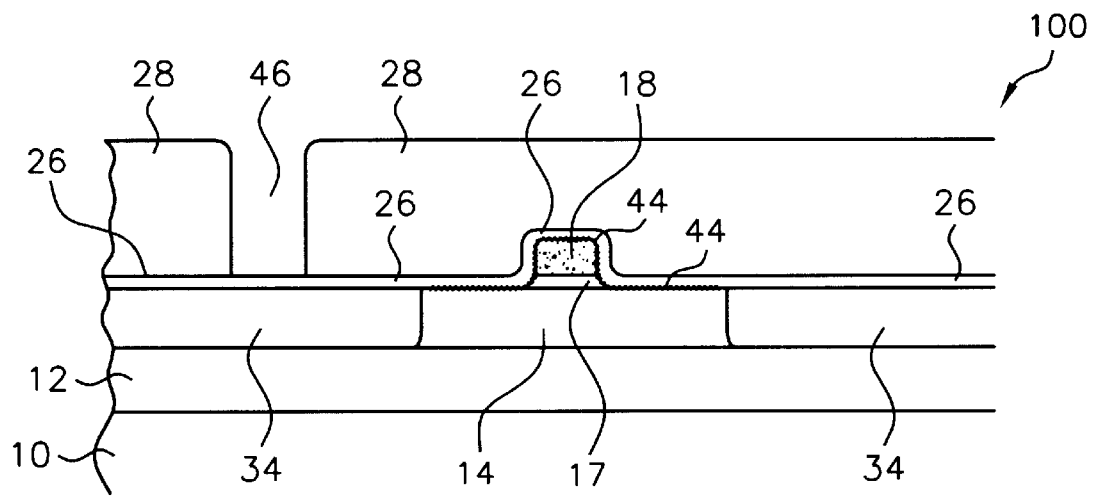
FIGS. 2A, 2B, and 2C illustrate a first embodiment of the process of manufacturing an isolation barrier in an SOI chip according to the present invention.
Figure 2B:
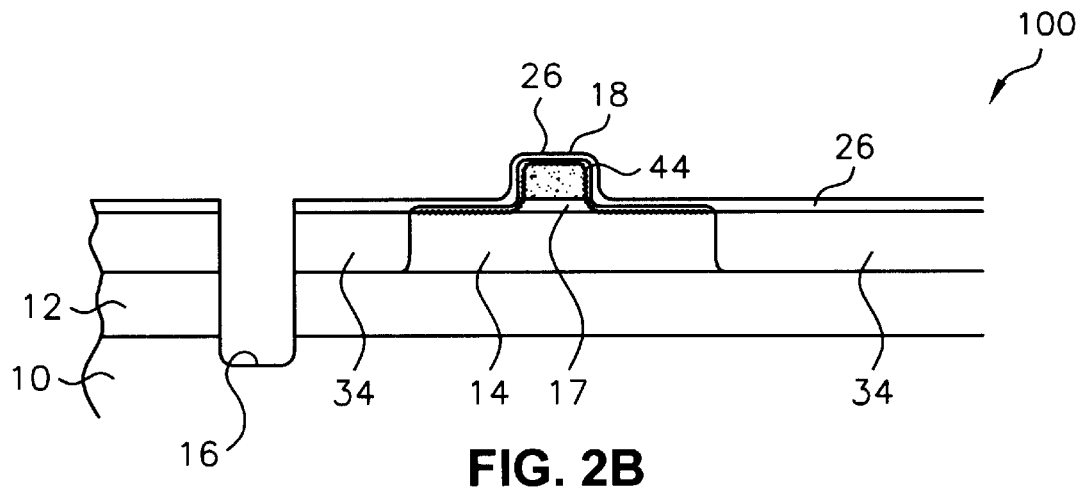
Figure 2C:
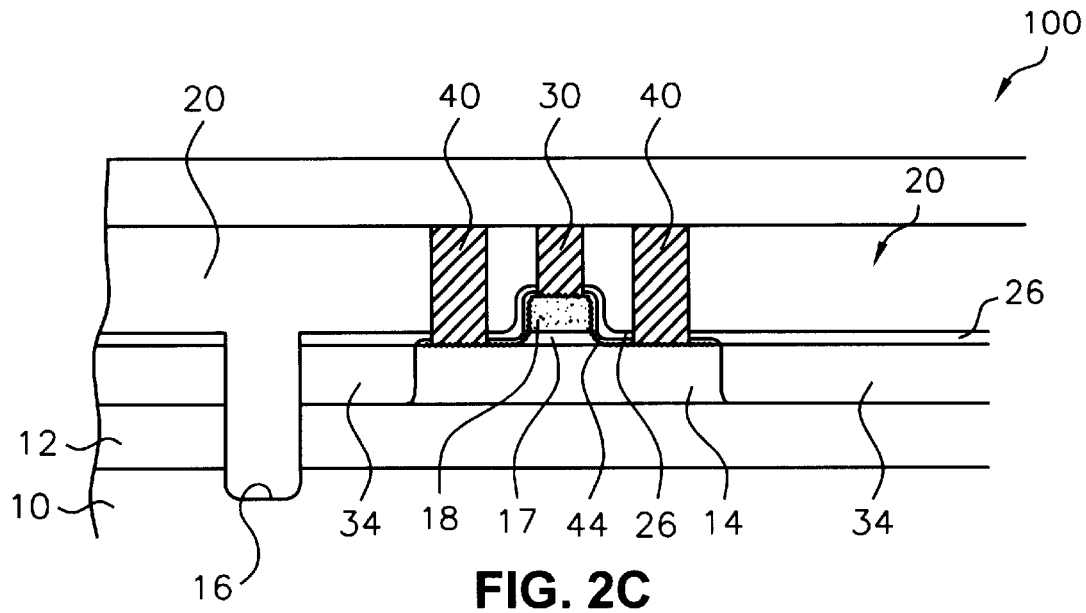

Referring now to the drawing, wherein like reference numbers refer to like elements throughout, an SOI chip 100 and process of making the SOI chip according to the present invention are illustrated in FIGS. 2A, 2B, and 2C. As shown in FIG. 2A, a substrate 10 is provided. Substrate 10 is typically composed, at least in part, of silicon. An oxide layer 12 is deposited above substrate 10. A silicon layer 14 is deposited above oxide layer 12, hence "burying" oxide layer 12 (which may be called a buried oxide layer or BOX). Silicon layer 14 includes at least one shallow trench 34 extending through silicon layer 14 to electrically separate active regions within silicon layer 14 from one another. These active regions typically include transistors formed in silicon layer 14. Trenches 34 are typically filled with an insulative oxide material.

A gate oxide layer 17 is deposited above silicon layer 14. A gate 18 is deposited above gate oxide layer 17. A silicide layer 44 is formed over gate 18 and silicon layer 14 (which is the diffusion region). A passivation layer 26 is deposited over SOI chip 100 both as a passivation layer and as an etch stop. Passivation layer 26 covers trenches 34, silicon layer 14, and gate 18 (i.e., the entire top surface of SOI chip 100). Passivation layer 26 typically includes silicon nitride, polysilicon, oxide, nitride, or other suitable passivating materials.

As illustrated in FIG. 2A, a photolithography mask or resist 28 is placed over passivation layer 26. Etching is typically done through resist 28 by reactive ion etching (also called plasma etching or dry etching). A lithography step defines an opening 46 in resist 28 around the perimeter of SOI chip 100. Next, opening 46 in resist 28 is used to etch through passivation layer 26, anisotropically through trench 34 and silicon layer 14, and, finally, through oxide layer 12 and partially into silicon substrate 10.

Figure 6:
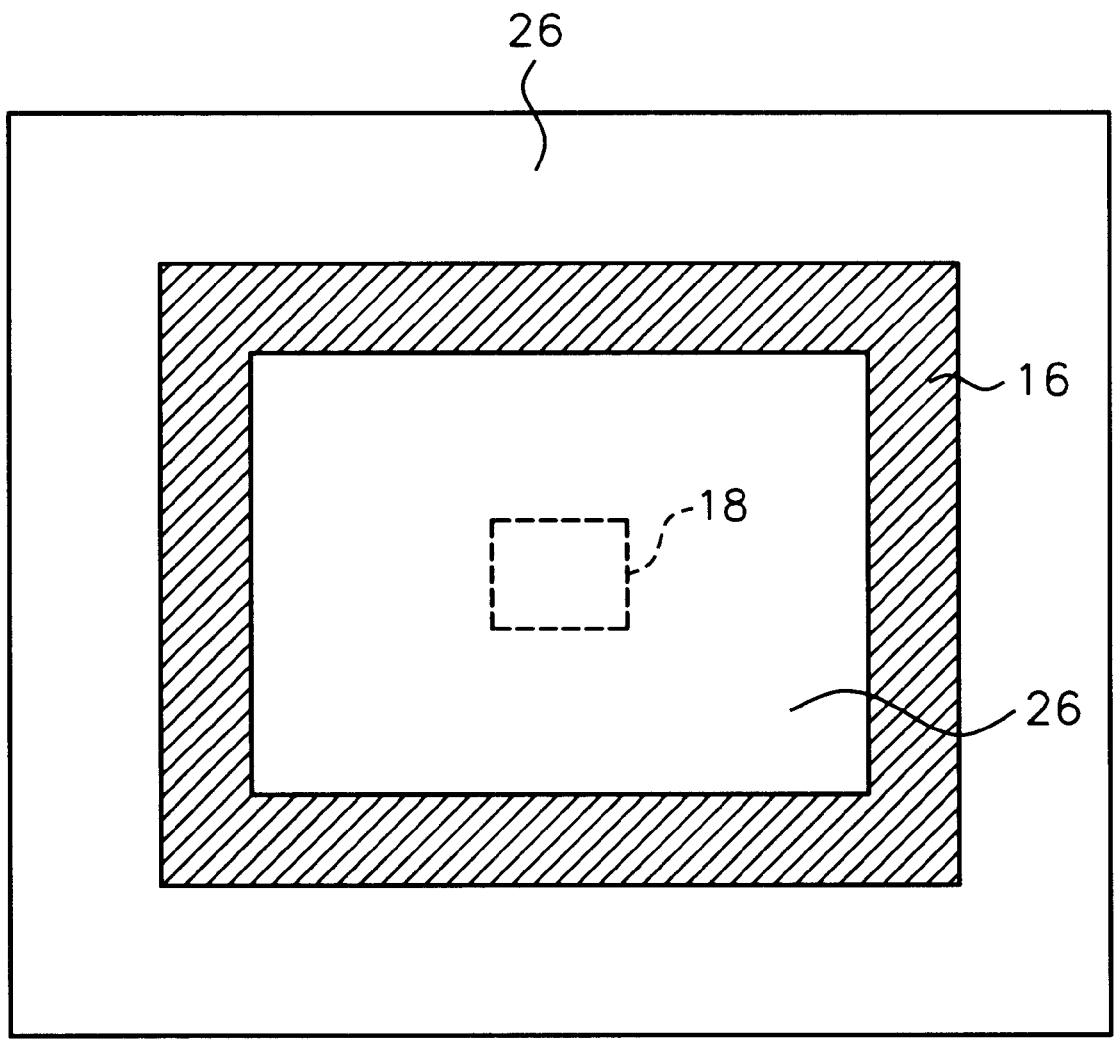
FIG. 6 is a top view of an SOI chip, having an isolation barrier, following several steps of the manufacturing process according to the present invention.

According to the present invention, after the etching process, resist 28 is removed or stripped. The result of the etching process is shown in FIG. 2B: a physical isolation barrier in the form of a ring or groove 16 which extends completely through passivation layer 26, silicon layer 14 and trench 34, and oxide layer 12. According to the embodiment illustrated in FIG. 2B, trench 16 further extends partially into substrate 10 to assure that it extends somewhat beyond the bottom of buried oxide layer 12. Groove 16 functions as a barrier preventing impurities in oxide layer 12 outside groove 16 from diffusing into oxide layer 12 inside groove 16. The dimensions of groove 16 may vary, depending on fabrication constraints, but are sufficiently narrow to occupy a minimal amount of chip real estate. A width of one or two microns will suffice, although smaller and larger dimensions are contemplated. FIG. 6 is a top view of SOI chip 100 illustrated in cross-section in FIG. 2C with gate 18 shown in phantom lines for purposes of orientation.

As illustrated in FIG. 2C, according to the process of making SOI chip 100 of the present invention, a barrier material 20 is deposited in groove 16. Barrier material 20 forms an additional (to groove 16) barrier preventing impurities in oxide layer 12 outside groove 16 from diffusing into oxide layer 12 inside groove 16. Barrier material 20 also prevents materials from undesirably filling groove 16 were groove 16 not already filled with barrier material 20.

As illustrated in FIG. 2C, barrier material 20 may also be deposited above passivation layer 26 along the entire surface of SOI chip 100. Barrier material 20 is typically a dielectric material such as phosphosilicate glass (PSG), BPSG, nitride, oxide or other similar material. PSG is an excellent gettering material for many mobile ions such as sodium and has been used for years for reliability passivation. Barrier material 20 is typically polished or etched to form a planar surface.

Next, metal contact lithography is performed. A gate metal contact 30 is deposited above gate 18. Gate metal contact 30 extends from the top of SOI chip 100 through barrier material 20, silicide layer 44, and passivation layer 26 to form an electrical contact with gate 18. Metal contacts 40 are deposited above selected areas of silicon layer 14 and extend from the top of SOI chip 100 through barrier material 20 and passivation layer 26 to form electrical contacts with selected areas of silicon layer 14. Finally, the device may be chem-mechanically polished (CMP).

As further illustrated in FIGS. 2C and 6, groove 16 surrounds gate 18, gate metal contact 30, and metal contacts 40 to define an active chip area inside groove 16. This active chip area includes one or more transistor regions formed in silicon layer 14, such as nFETS or pFETS, which become electrically active as potentials are applied to gate metal contact 30 and metal contacts 40. Groove 16 defines this active chip area because it is located sufficiently radially outward from gate 18 and metal contacts 30, 40 to enclose all of the electrically active regions in SOI chip 100. Areas outside groove 16 remain electrically inactive as potentials are applied to metal contacts 30 and 40.

Figure 2D:
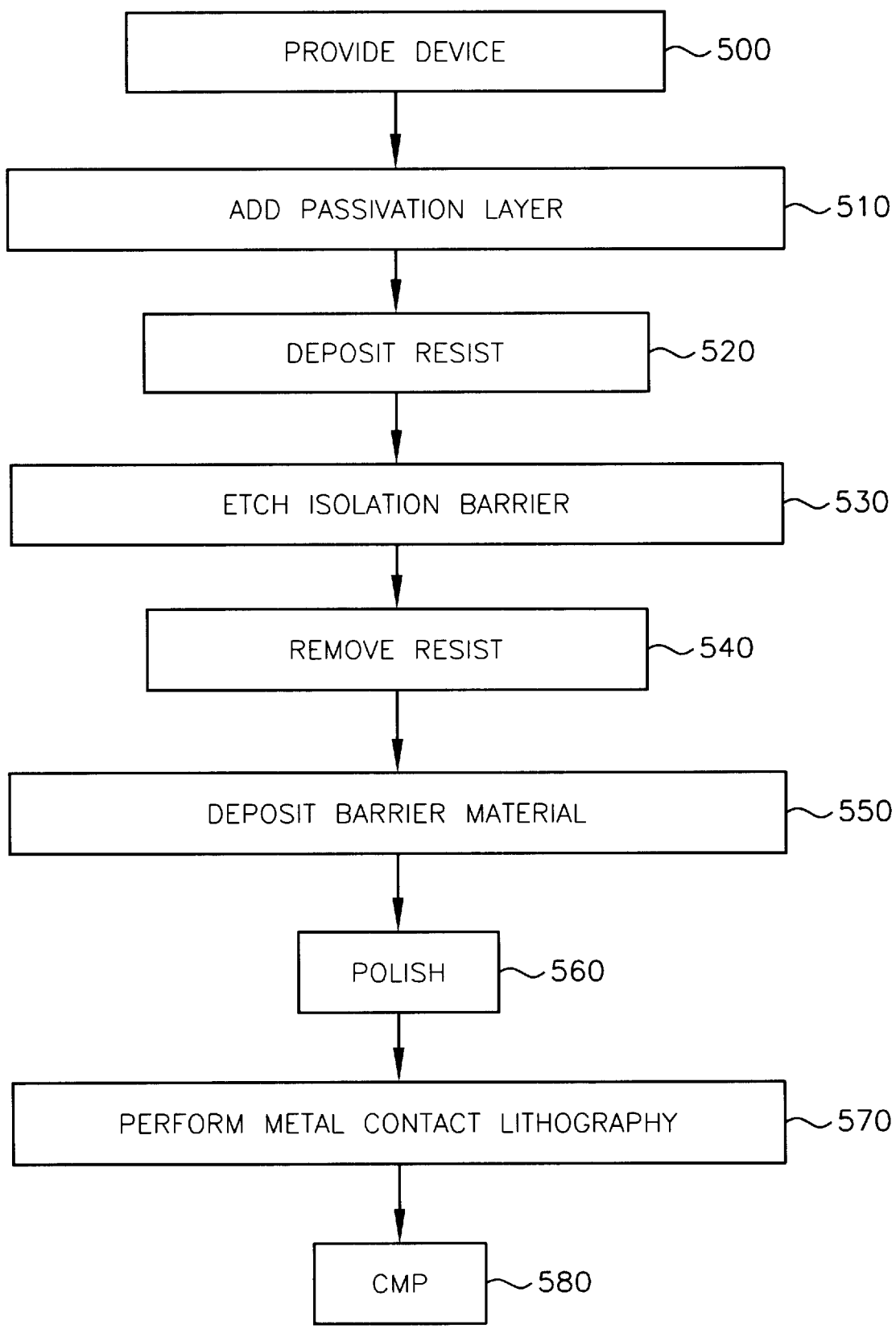
FIG. 2D is a flow chart illustrating the steps of the process used to manufacture the SOI chip shown in FIG. 2C.

The first embodiment of the process of manufacturing SOI chip 100 having a groove 16 as an integrated diffusion barrier includes the following steps (illustrated in FIG. 2D). First, a device having substrate 10, buried oxide layer 12, silicon layer 14 with at least one trench 34, gate 18, and silicide layer 44 is provided (Step 500). Passivation layer 26 is deposited (Step 510), resist is applied (Step 520), groove 16 is etched (Step 530), resist 28 is removed (Step 540), barrier material 20 is deposited (Step 550), barrier material 20 is polished (Step 560), metal contact lithography is performed (Step 570), and a final CMP is done (Step 580). A single photolithography mask or resist 28 is deposited (Step 520). A single reactive ion etching step is applied (Step 530). Finally, the resist 28 is stripped (Step 540).

The first embodiment of the process of manufacturing SOI chip 100 having a groove 16 as an integrated diffusion barrier requires only three extra steps over a conventional SOI chip 1 which is not protected from impurities because of exposed diced edges 42. Moreover, the first embodiment of manufacturing SOI chip 100 requires only three extra steps whereas other processes, such as described in Japanese Patent Reference 6-177242, require at least six extra steps.

Figure 3:
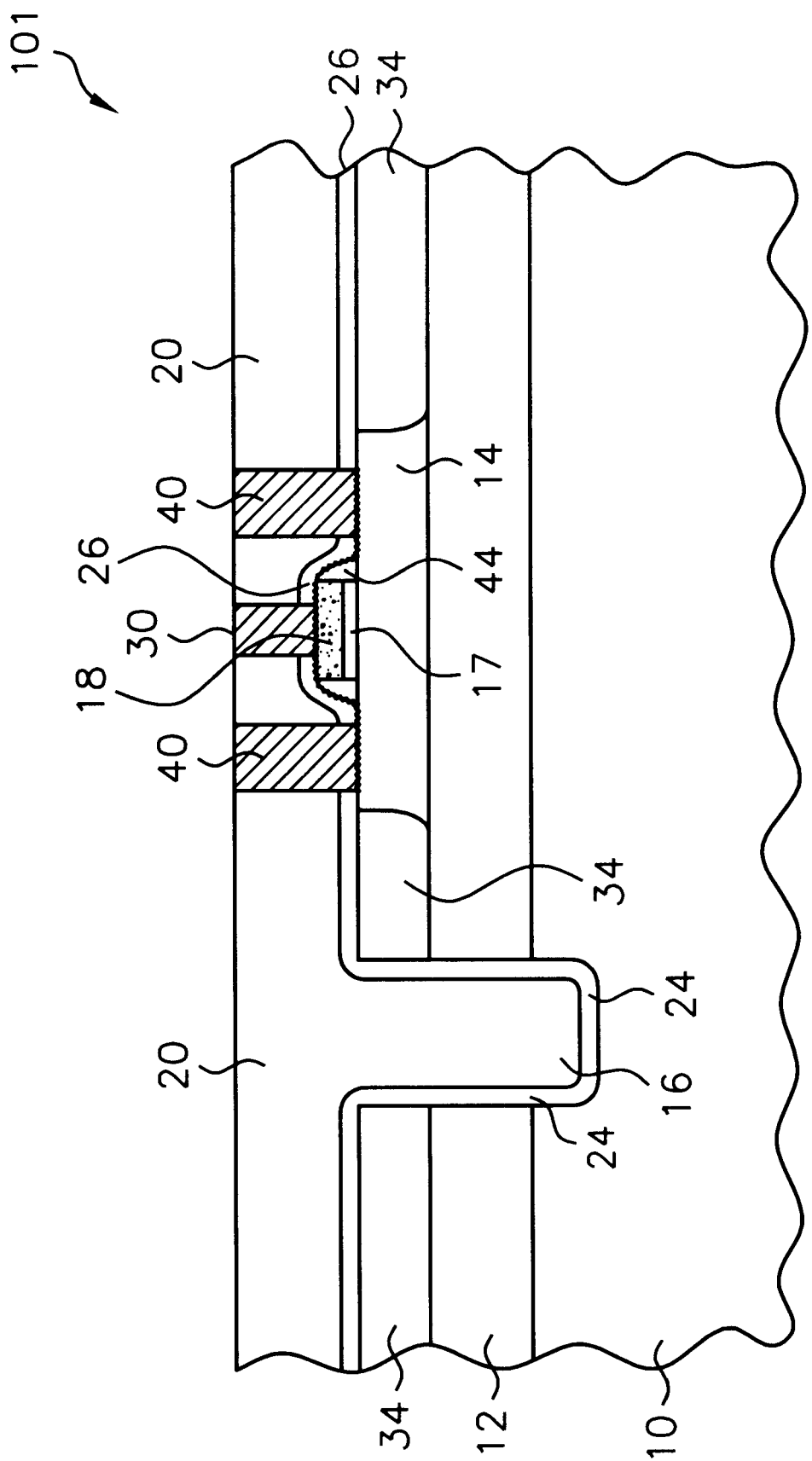
FIG. 3 illustrates a second embodiment of the SOI chip having an isolation barrier according to the present invention.

The SOI chip 101 illustrated in FIG. 3 is similar to the SOI chip 100 shown in FIG. 2C. The difference between SOI chip 101 and SOI chip 100 is that groove 16 of SOI chip 101 has passivation coating 24 along its side walls and bottom. Preferably, passivation coating 24 is silicon nitride. Silicon nitride is one of the best barriers to impurity diffusion, including metals and many gaseous species. Alternatively, passivation coating 24, may be polysilicon, oxide, nitride, or other suitable passivating materials.

The process by which SOI chip 101 is manufactured is similar to the process illustrated in FIG. 2D except that passivation layer 26 is deposited (Step 510) after the resist 28 is removed (Step 540) instead of immediately after providing the device in which groove 16 will be etched. Consequently, passivation layer 26 extends into groove 16, as passivation layer 24, and covers completely the bottom and side walls of groove 16. Alternatively, groove 16 could be coated with a film such as polysilicon or oxide if preferred to meet process integration demands. Barrier material 20 is then deposited on passivation layer 24, filling the remaining void in groove 16, and on passivation layer 26, coating the top of SOI chip 101. The last three steps of the manufacturing process for SOI chip 101 are the same as those by which SOI chip 100 is made: barrier material 20 is polished (Step 560), metal contact lithography is performed (Step 570), and a final CMP is done (Step 580).

Thus, the second embodiment of the process of manufacturing SOI chip 101 having a groove 16 as an integrated diffusion barrier includes the following steps. First, a device having substrate 10, buried oxide layer 12, silicon layer 14 with at least one trench 34, gate 18, and silicide layer 44 is provided (Step 500). Resist is applied (Step 520), groove 16 is etched (Step 530), and resist 28 is removed (Step 540). Then passivation layer 26 is deposited (Step 510). Subsequently, barrier material 20 is deposited (Step 550), barrier material 20 is polished (Step 560), metal contact lithography is performed (Step 570), and a final CMP is done (Step 580).

Figure 4:
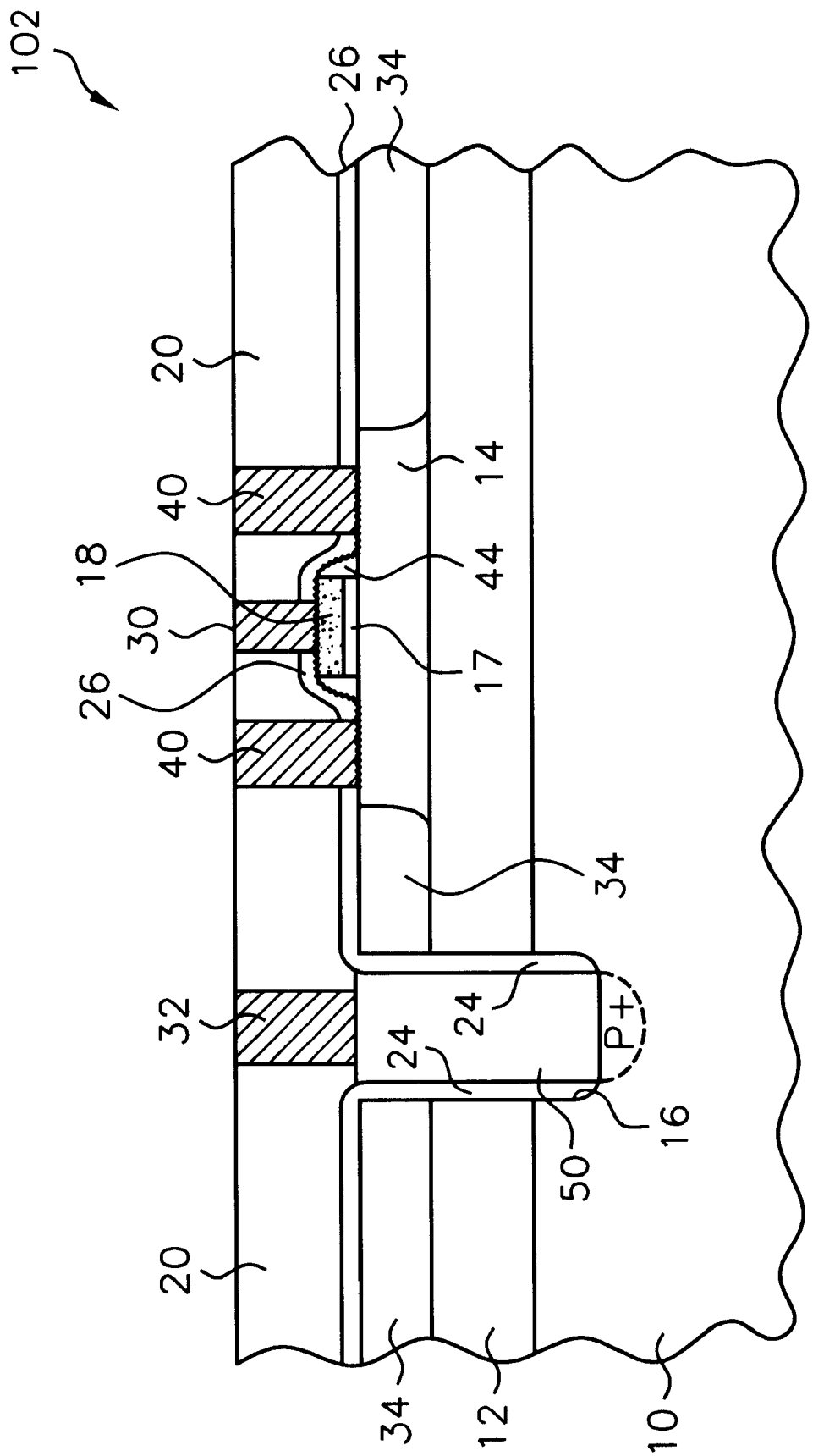
FIG. 4 illustrates a third embodiment of the SOI chip having an isolation barrier according to the present invention.

A third embodiment of the SOI chip 102 of the present invention is illustrated in FIG. 4. SOI chip 102 shown in FIG. 4 is similar to SOI chip 101 of FIG. 3 in that passivation layer 24 is deposited in groove 16, and passivation layer 26 is deposited over silicon layer 14 (including trench 34) and gate 18, after groove 16 is formed in the SOI chip. Passivation layer 24 may be a dielectric such as silicon nitride or a composite of silicon dioxide and silicon nitride. Unlike the process used to manufacture SOI chip 101 of FIG. 3, however, an anisotropic etch is then applied to groove 16 of SOI chip 102. The anisotropic etch removes a portion of passivation layer 24 extending along the bottom of groove 16. Consequently, passivation layer 24 extends into groove 16 only along the side walls of groove 16 and the bottom of groove 16 is open to silicon substrate 10. Groove 16 retains the dielectric and passivation properties, however, on its side walls.

Fill material 50 is then deposited in groove 16, filling the remaining void in groove 16. Because the portion of passivation layer 24 along the bottom of groove 16 has been removed, fill material 50 makes a direct contact with substrate 10. Fill material 50 within groove 16, as illustrated in FIG. 4, may be composed of polysilicon or other similar material. Fill material 50 within groove 16 may then be doped conductive to provide, in addition to a diffusion barrier, an electrical contact to substrate 10 from the top surface of SOI chip 102. Such electrical contact is advantageous to control the voltage of substrate 10 and, specifically, to ensure that substrate 10 does not float above a certain voltage which could activate back gate devices.

After the additional steps of an anisotropic etch applied to groove 16 and the deposit of fill material 50 in groove 16, both performed after passivation layers 24 and 26 are deposited (passivation layers 24 and 26 may be, but are not necessarily, the same composition), the remaining steps of the process used to manufacture SOI chip 101 of FIG. 3 are applied to complete SOI chip 102 of FIG. 4. Those steps include depositing barrier material 20 (Step 550), polishing barrier material 20 (Step 560), performing metal contact lithography (Step 570), and completing a final CMP (Step 580). During the metal contact lithography step, a fourth metal contact 32 may be deposited above groove 16. Metal contact 32 extends from the top of SOI chip 102 through barrier material 20 above groove 16 and forms an electrical contact with doped fill material 50 within groove 16. This contact permits voltage regulation of substrate 10 from the top SOI chip 102.

Thus, the third embodiment of the process of manufacturing SOI chip 102 having a groove 16 as an integrated diffusion barrier includes the following steps. First, a device having substrate 10, buried oxide layer 12, silicon layer 14 with at least one trench 34, gate 18, and silicide layer 44 is provided (Step 500). Resist is applied (Step 520), groove 16 is etched (Step 530), and resist 28 is removed (Step 540). Then passivation layer 26 is deposited (Step 510). An anisotropic etch is applied to groove 16 and fill material 50 is deposited in groove 16. Then fill material 50 is etched to form a planar structure. Subsequently, barrier material 20 is deposited (Step 550), barrier material 20 is polished (Step 560), metal contact lithography is performed (Step 570), and a final CMP is done (Step 580).

Figure 5B:
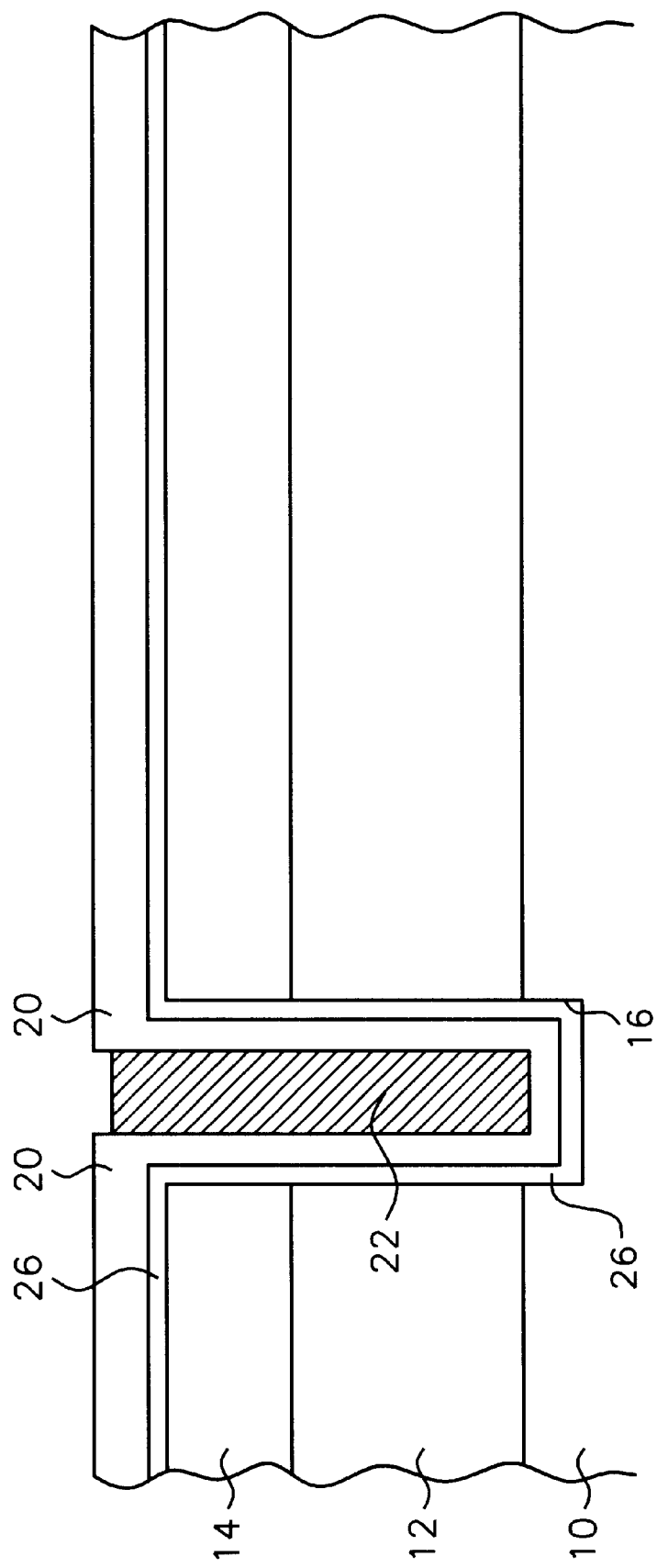
Figure 5C:
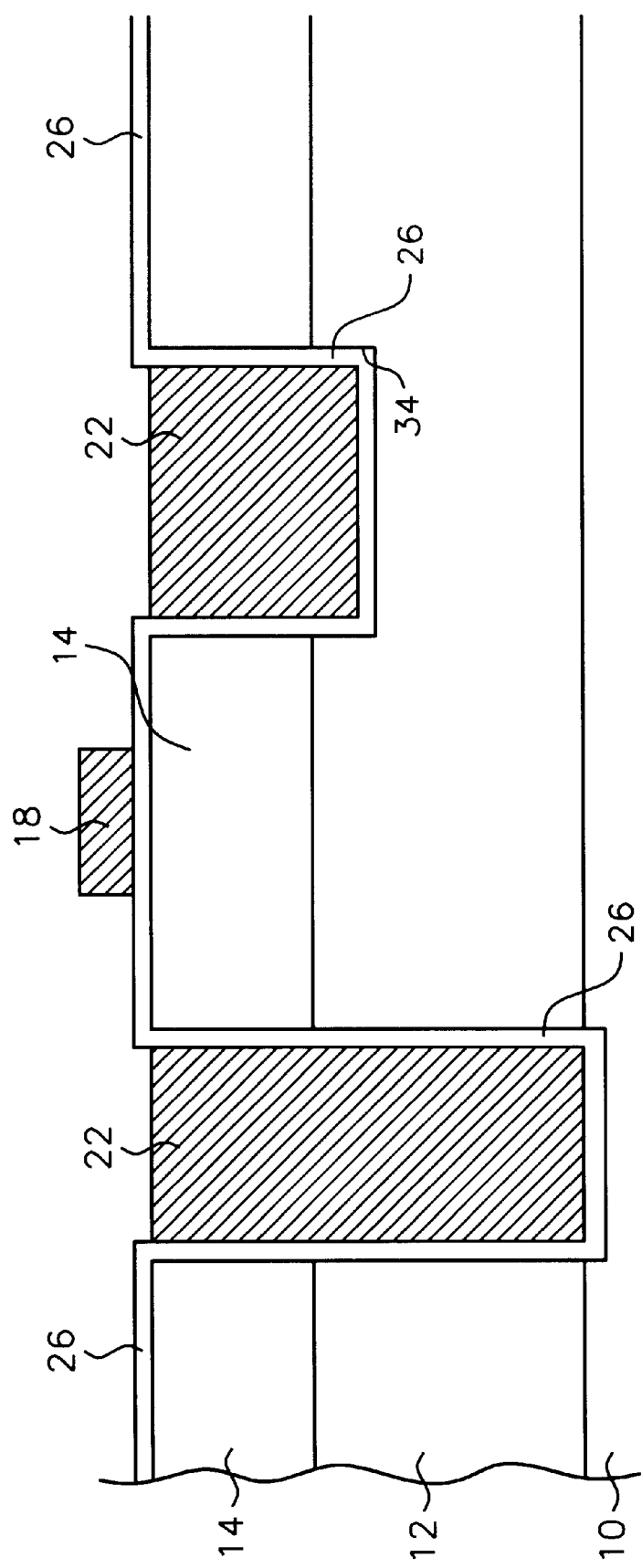

Described above are suitable process steps used to manufacture the SOI chip of the present invention. A large number of variations are possible in those process steps. FIGS. 5A, 5B, and 5C illustrate embodiments, for example, in which the isolation barrier is formed in the SOI chip before gate 18 is created.

As illustrated in FIGS. 5A and 5B, groove 16 may be formed in the SOI chip before gate 18 is deposited above silicon layer 14. Passivation layer 26 is deposited on silicon layer 14 after groove 16 is formed in the SOI chip. Therefore, passivation layer 26 extends into groove 16 and extends along the bottom and side walls of groove 16. Barrier material 20 is then deposited on passivation layer 26, filling part of the remaining void in groove 16 and coating the top surface of the SOI chip. As illustrated in FIG. 5A, only a portion of groove 16 is filled with barrier material 20, leaving an open area of groove 16. This open area may then be filled with an oxide 22, as illustrated in FIG. 5B, which may be deposited by chemical vapor deposition or other suitable processes. Following a planarization step, process steps similar to those outlined above may be applied to the device illustrated in FIG. 5B.

FIG. 5C also illustrates an SOI chip in which groove 16 is formed before gate 18 is deposited above silicon layer 14. Trench 34 is also formed in silicon layer 14, extending partially into buried oxide layer 12. Passivation layer 26 is deposited on silicon layer 14 after groove 16 and trench 34 are formed in the SOI chip. Therefore, passivation layer 26 extends into groove 16 and extends along the bottom and side walls of groove 16. Passivation layer 26 also covers the bottom and side walls of trench 34. Barrier material would 20 would then fill part of the remaining voids in groove 16 and trench 34 and coat the top surface of the SOI chip as in FIGS. 5A and 5B. In FIG. 5C, however, rather than deposit barrier material 20 on passivation layer 26, fill part of the remaining voids in groove 16 and trench 34 and coat the top surface of the SOI chip, gate 18 is placed on passivation layer 26. As illustrated in FIG. 5C, an oxide 22 is deposited in groove 16 and trench 34.

Further variations in the process steps used to manufacture the SOI chip of the present invention are possible. These variations may involve, for example, the location in the process where groove 16 is etched. The location is not critical. Groove 16 may be etched early in the manufacturing process so that formation of groove 16 can be included as part of the formation of trench 34; the etching step may be added later in the process just before metallization. Each approach may have specific advantages depending on process integration demands.

Figure 7A:
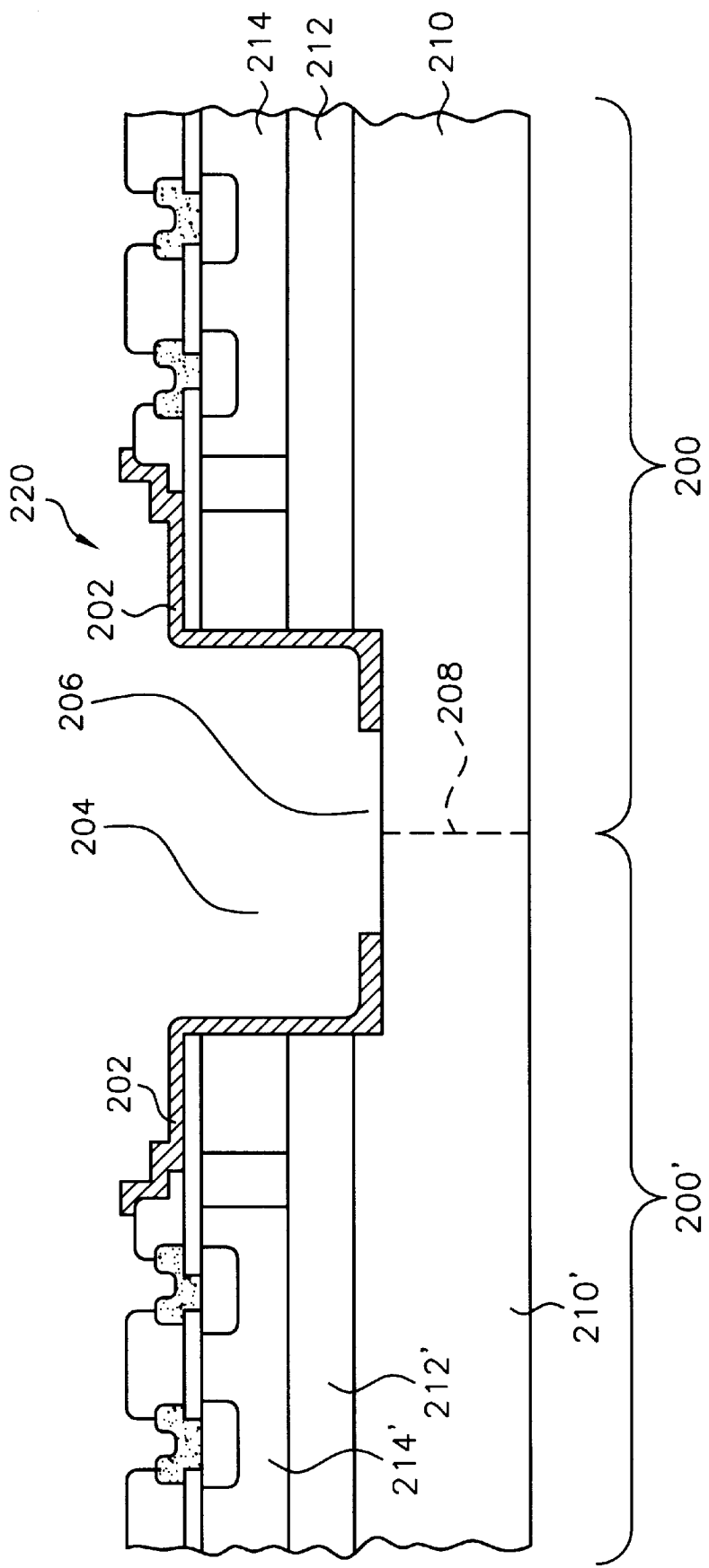
FIG. 7A illustrates the interim structure of a conventional SOI wafer before it is diced into separate SOI chips.
Figure 7B:
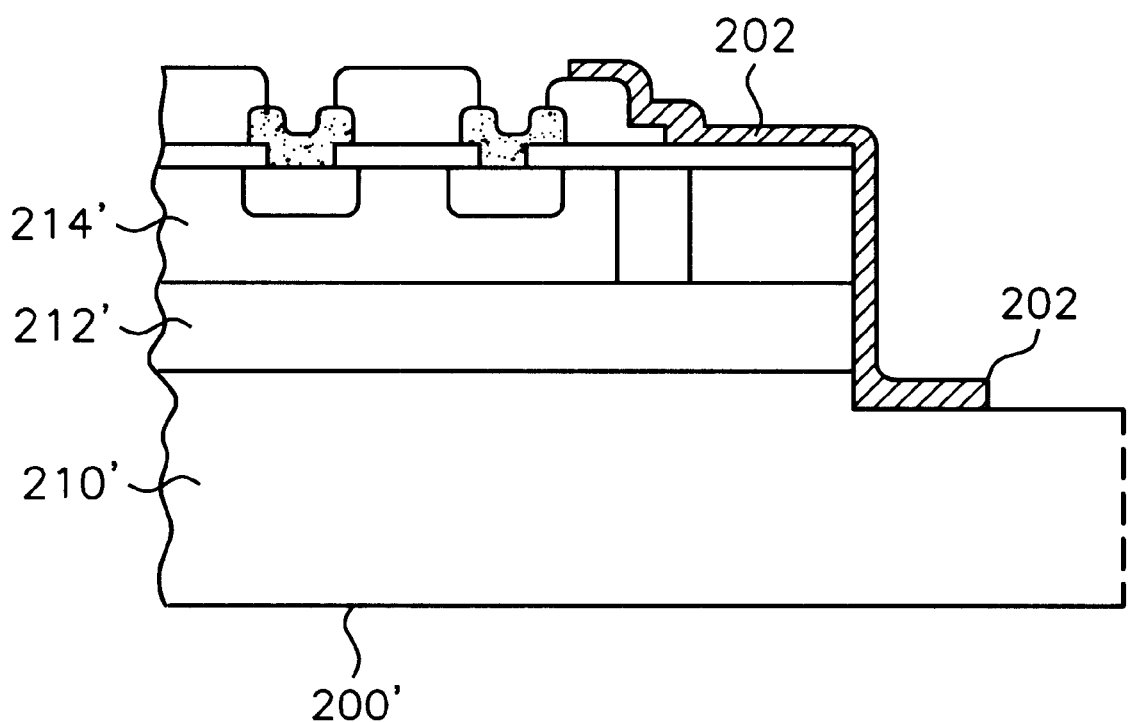
FIG. 7B illustrates one of the SOI chips after dicing the SOI wafer shown in FIG. 7A.

As illustrated in FIGS. 7A and 7B, and in Japanese Published Patent Document No. 6-177242, Motonori describes the use of a diffusion protect layer 202 for passivating the edges of SOI chips to prevent the diffusion of mobile ions, such as Na+ or other positive ion contaminants. The diffusion protect layer 202 described by Motonori typically consists of a metal film.

FIG. 7A illustrates the interim structure of an SOI wafer 220 before it is diced into separate SOI chips 200 and 200'. Each chip 200 (200') has a silicon substrate 210 (210'), a buried oxide layer 212 (212'), and a silicon layer 214 (214'). According to Motonori, an area 204 is opened temporarily in SOI wafer 220 to allow the deposition of diffusion protect layer 202, using a mask, to protect oxide layer 212 (212') from the diffusion of impurities. Area 204 is described as having a width on the order of many hundreds of microns. Next, Motonori again uses a mask to remove diffusion protect layer 202 in a region 206 where a dicing saw will cut the SOI chips apart along line 208. FIG. 7A illustrates the SOI wafer 220 just before dicing.

As illustrated in FIG. 7B, after dicing, the final SOI chip 200 (200') contains neither a planarized structure nor a groove integral with and internal to the chip structure (i.e., a groove positioned away from the periphery or edge of the chip). Further, diffusion protect layer 202 is patterned or "cut" on top of the chip, providing a non-continuous film along the top. Because diffusion protect layer 202 is removed selectively from the dicing regions, additional chip area is required to accommodate photolithography alignment tolerances.

Figure 8A:
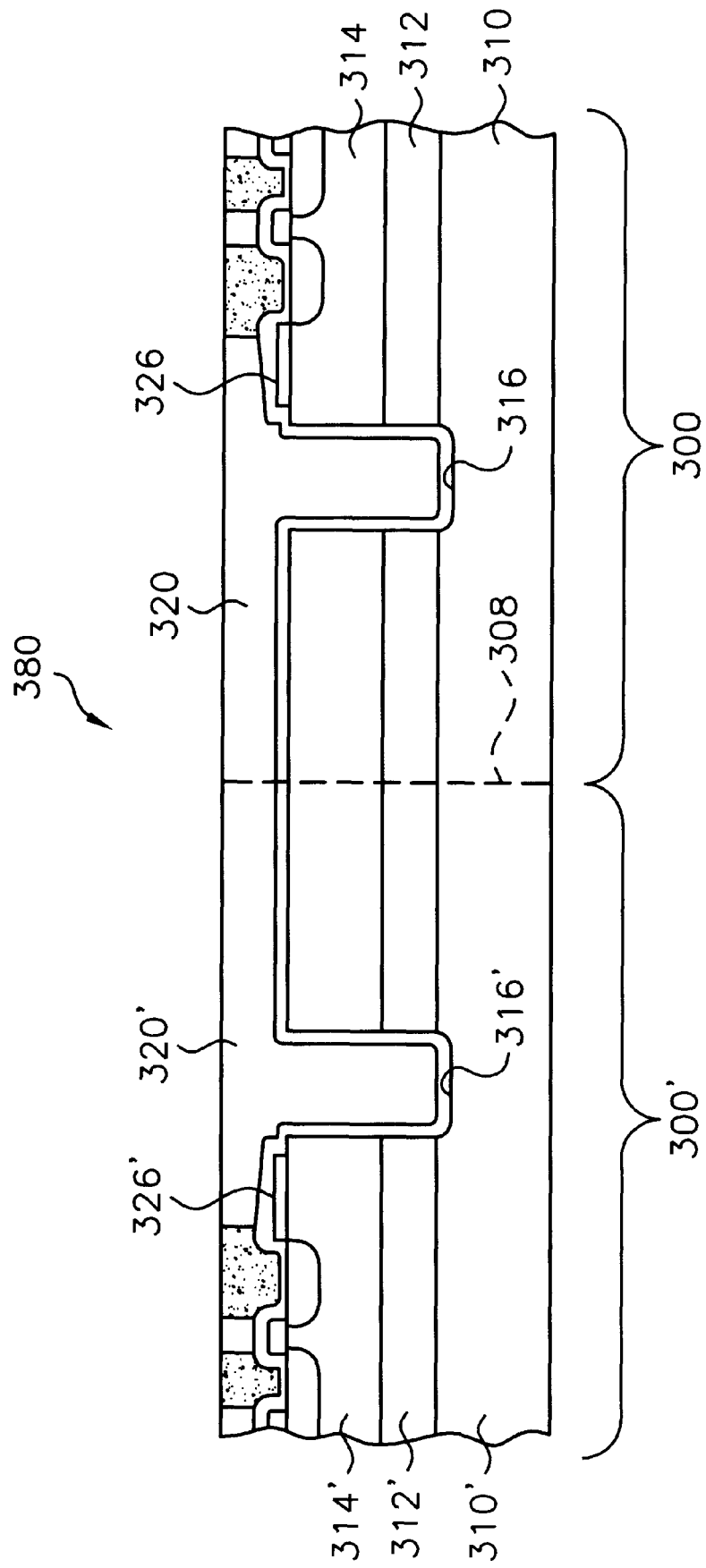
FIG. 8A illustrates the interim structure of an SOI wafer, according to the present invention, before it is diced into separate SOI chips.
Figure 8B:
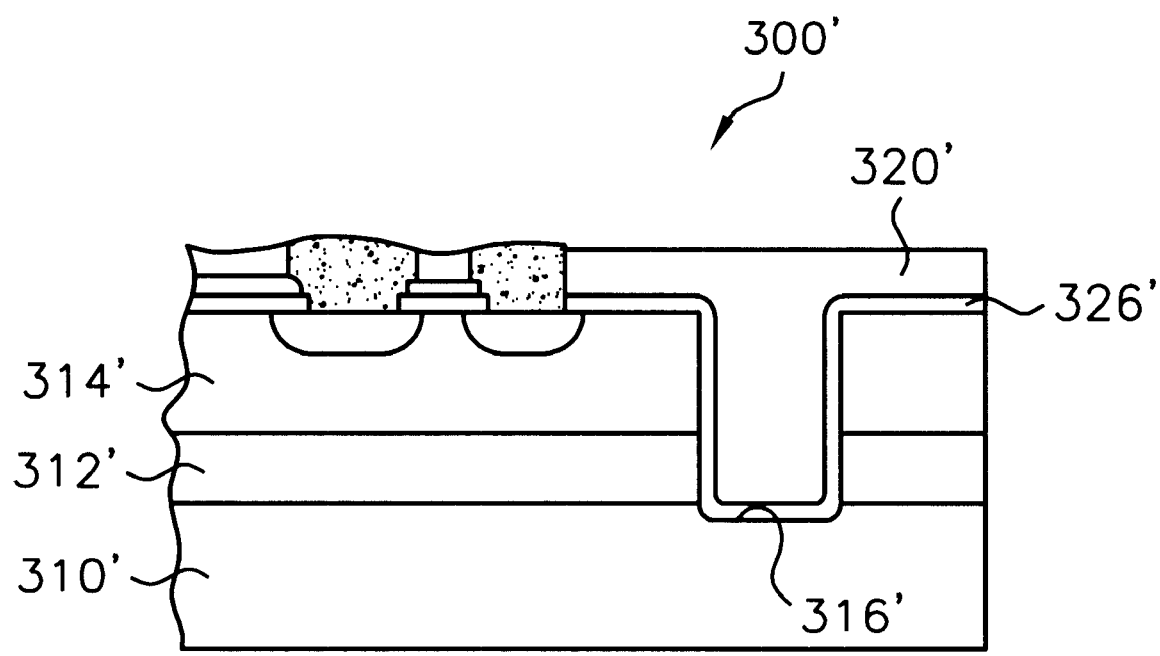
FIG. 8B illustrates one of the SOI chips after dicing the SOI wafer shown in FIG. 8A.

FIG. 8A illustrates the interim structure of an SOI wafer 380, according to the present invention, before it is diced into separate SOI chips 300 and 300'. Each SOI chip 300 (300') has a silicon substrate 310 (310'), a buried oxide layer 312 (312'), a silicon layer 314 (314'), a groove 316 (316'), a passivation layer 326 (326'), and a barrier material 320 (320'). Thus, each chip 300 (300') is manufactured pursuant to the process described above and illustrated in FIG. 3. A dicing saw will cut the SOI chips 300, 300' apart along line 308. Once separated, SOI chip 300' will appear as shown in FIG. 8B. Compare SOI chip 101 of FIG. 3 with SOI chip 300' of FIG. 8B. SOI chips 101 and 300' are nearly identical except that passivation layer 24 of FIG. 3 need not be identical with passivation layer 26 of FIG. 3; passivation layer 326' covers both the top of SOI chip 300' and groove 316' in FIG. 8B.

Unlike the devices of Montonori, the SOI chips 100, 101, 102, 300, and 300' of the present invention each have a relatively narrow groove. Typically, grooves 16, 316, and 316' are on the order of one or two microns wide. Moreover, the groove (or isolation barrier) of the present invention is integrated with structure of the SOI chip itself, rather than on its edge, and provides a continuous boundary to the diffusion of impurities from outside the SOI chip. In addition, the SOI chip according to the present invention does not require any additional processing steps before dicing the chip.

The SOI chip and manufacturing process according to the present invention have additional advantages over prior art devices and techniques such as those described by Motonori. First, manufacturing of SOI chip 100 (for example) only requires one photolithography mask for processing the diffusion barrier; Motonori requires two photolithography masks. The use of a second photolithography mask exposes the chip to possible further defects and damage from the reactive ion etching plasma charging.

Second, SOI chip 100 has a continuous diffusion barrier along all sides and the top of the SOI chip; Motonori only provides a non-continuous diffusion barrier. Third, minimal chip area is occupied by the isolation barrier (specifically, the groove) in SOI chip 100; the depth of the groove will generally not exceed 6–7,000 angstroms. In contrast, the device of Montonori has a much wider and deeper area formed through the metal insulators, the silicon layer, and the buried oxide layer. The area described is well over 10,000 angstroms deep and exposes the finished metallized chip to possible etching damage by charging.

Furthermore, because the groove formed in SOI chip 100 is relatively narrow, SOI chips 100 can be spaced closer together during manufacturing so that more chips can be cut from a single wafer. The device of Motonori requires larger dicing regions to allow the diffusion barrier to be removed. This requires, in turn, that the SOI chips of Montonori be spaced further apart when they are cut, creating alignment tolerance problems. Fourth, because (a) fewer steps are required to manufacture SOI chip 100, and (b) less chip area is occupied, the cost of manufacturing the SOI chip according to the present invention is relatively inexpensive compared to the cost required to manufacture according to Motonori. Fifth, the final structure of the present SOI chip is planarized while the SOI chip by Motonori is not planarized. Sixth, the barrier material used in SOI chip 100 is a "gettering material," which conforms easily to the shape of the groove. Motonori teaches the use of a sputtered film which does not conform as easily and is more likely to experience breaks. Seventh, the barrier material used in SOI chip 100 is deposited as part of an existing step in the manufacturing process of the chip. In Motonori, an additional film material is required to form the diffusion barrier. Finally, SOI chip 100 of the present invention has a planar final structure; the device of Montonori has a non-planar final structure.

Figure 9A:
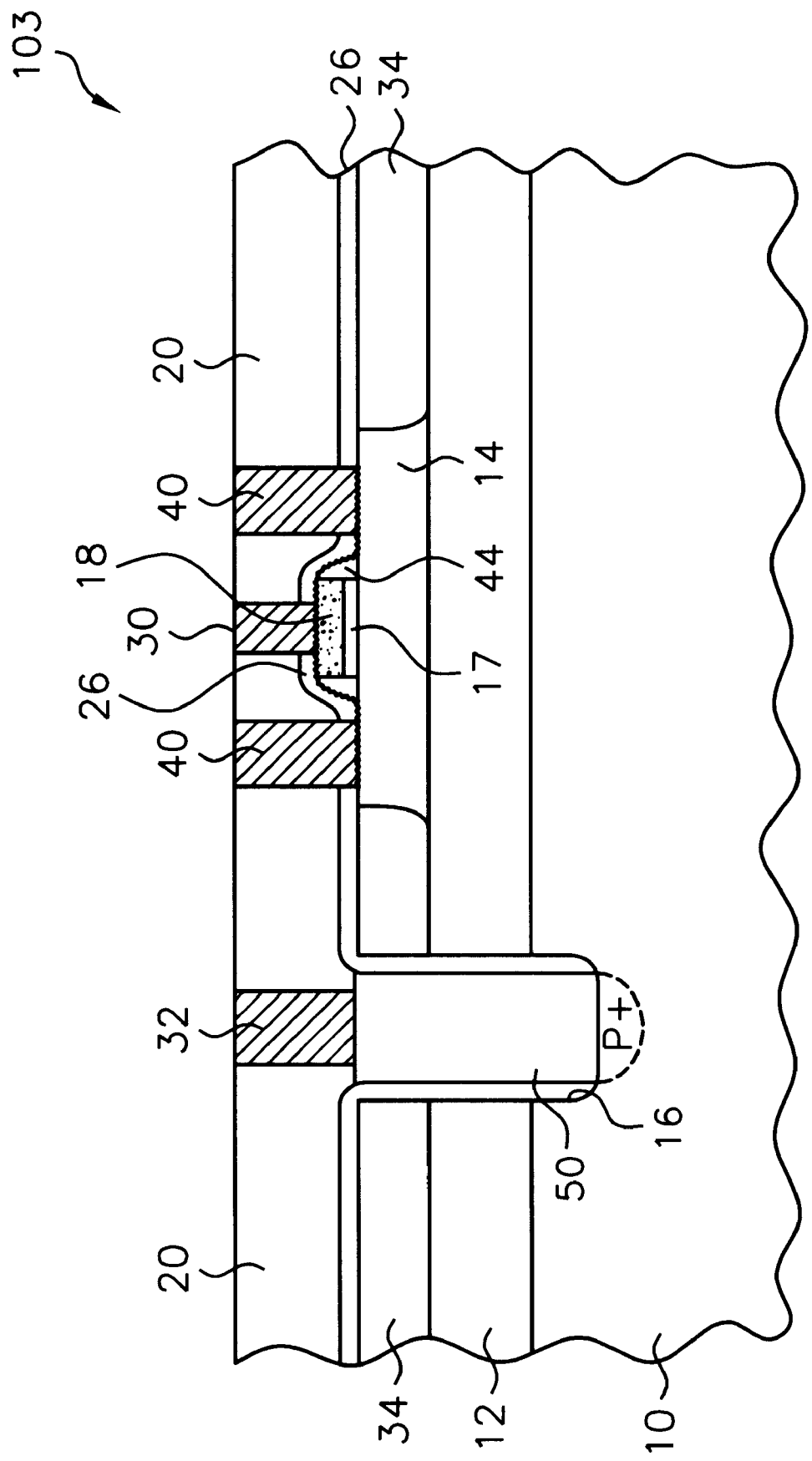
FIGS. 9A, 9B and 9C illustrate fourth, fifth and sixth embodiments, respectively, of the SOI chip having an isolation barrier according to the present invention.

A fourth embodiment of the SOI chip 103 of the present invention is illustrated in FIG. 9A. SOI chip 103 shown in FIG. 9A is similar to SOI chip 102 shown in FIG. 3, except that there is no passivation layer 24 deposited in groove 16, and passivation layer 26 on silicon layer 14 extends to groove 16. Groove 16 is filled with fill material 50.

Figure 9B:
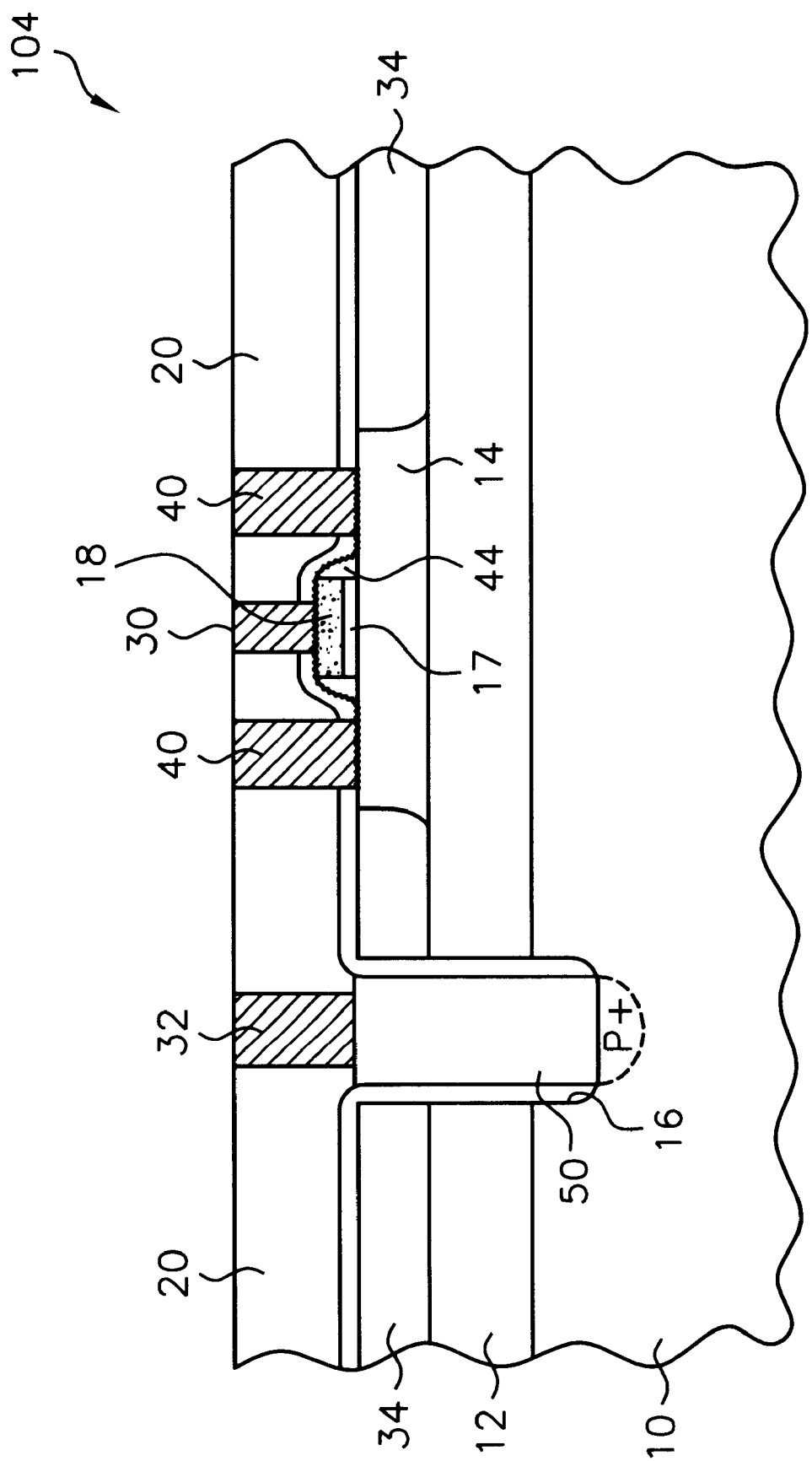
Figure 9C:
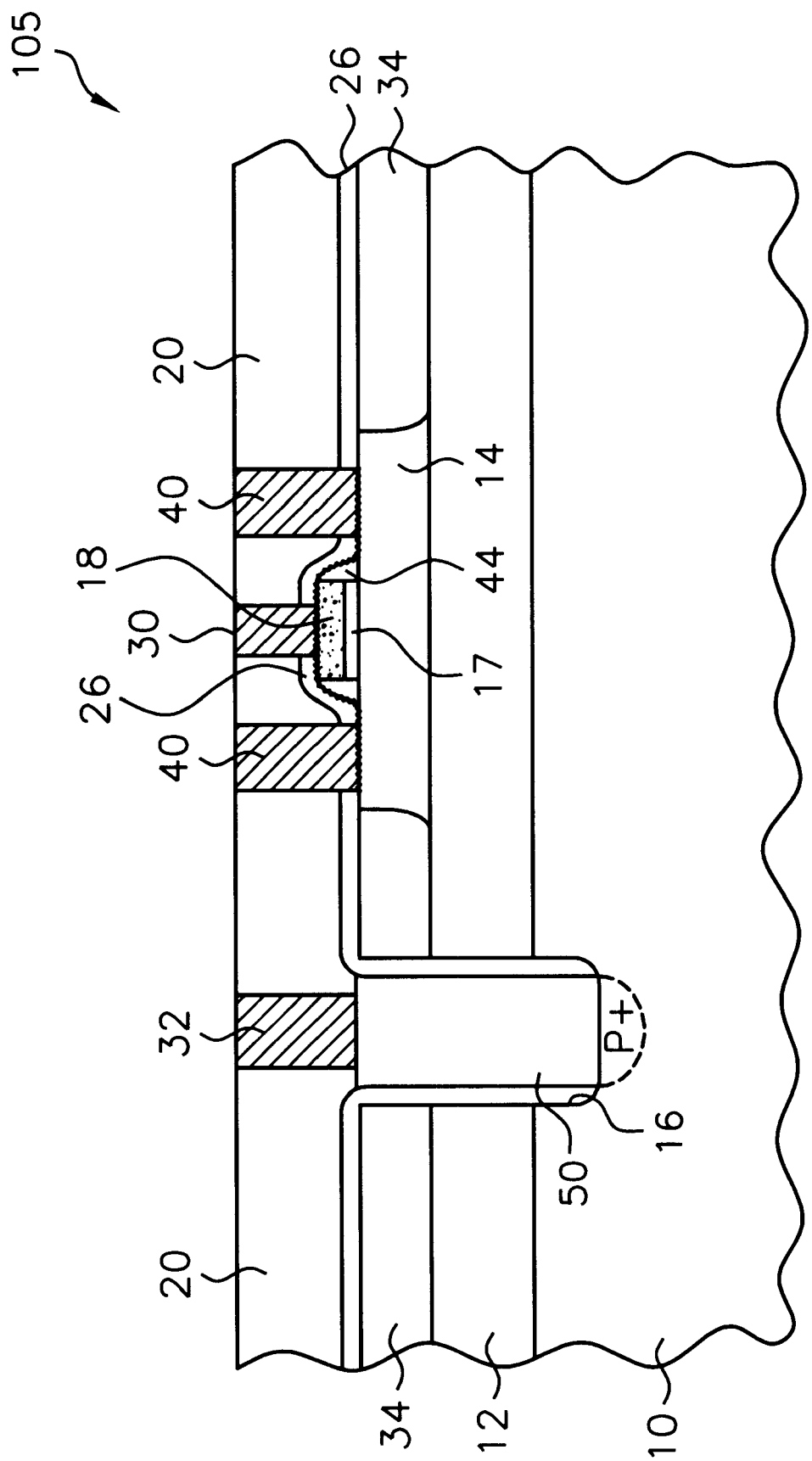

A fifth embodiment of the SOI chip 104 of the present invention is illustrated in FIG. 9B. SOI chip 104 is similar to SOI chip 103 shown in FIG. 9A, except that there is no passivation layer 26. And a sixth embodiment of the SOI chip 105 of the present invention is illustrated in FIG. 9C. SOI chip 105 shown in FIG. 9C is similar to SOI chip 103 shown in FIG. 9A, except that the passivation layer 26 is deposited over fill material 50 except for where fourth metal contact 32 contacts fill material 50.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention. The isolation barrier of the present invention is applicable, for example, to technologies such as bipolar, bi-complementary metal-oxide-semiconductor (bicmos), dynamic random access memory (DRAM), and the like on SOI substrates.

What is claimed is:

1. A silicon-on-insulator (SOI) semiconductor chip comprising:

a peripheral edge;
   a substrate;
   an oxide layer on the substrate;
   a silicon layer on the oxide layer;
   an active area;
   an isolation barrier including a groove:
      (a) being disposed slightly inward of the peripheral edge of the chip,
      (b) extending through the silicon layer and through the oxide layer and partially into the substrate to prohibit impurities in the oxide layer outside the isolation barrier from diffusing into the oxide layer inside the isolation barrier, and
      (c) surrounding completely the active area of the chip, and
   a passivation layer on the silicon layer and extending to the groove.

2. The SOI chip according to claim 1 wherein the active area of the chip includes a gate located on the silicon layer, a gate metal contact deposited above and forming an electrical contact with the gate, and at least one metal contact deposited above and forming an electrical contact with the silicon layer.

3. The SOI chip according to claim 1 wherein the passivation layer is selected from the group consisting of silicon nitride, polysilicon, oxide, and nitride.

4. The SOI chip according to claim 1 further comprising a barrier material located (i) over the passivation layer on the silicon layer, and (ii) in the groove presenting an additional barrier to impurities in the oxide layer outside the groove from diffusing into the oxide layer inside the groove.

5. The SOI chip according to claim 4 wherein the barrier material is dielectric.

6. The SOI chip according to claim 5 wherein the barrier material is selected from the group consisting of phosphosilicate glass (PSG), BPSG, nitride and oxide.

7. The SOI chip according to claim 1 further comprising the passivation layer on the silicon layer and in the groove.

8. The SOI chip according to claim 7 wherein the passivation layer is selected from the group of silicon nitride, polysilicon, oxide, and nitride.

9. The SOI chip according to claim 7 further comprising an oxide located in the groove and over the passivation layer which is on the silicon layer and in the groove.

10. The SOI chip according to claim 7 further comprising a barrier material located on the passivation layer, over the silicon layer and in the groove, presenting an additional barrier to impurities in the oxide layer outside the groove from diffusing into the oxide layer inside the groove.

11. The SOI chip according to claim 10 wherein the barrier material is dielectric.

12. The SOI chip according to claim 11 wherein the barrier material is selected from the group consisting of phosphosilicate glass (PSG), BPSG, and nitride.

13. The SOI chip according to claim 10 further comprising an oxide located in the groove and over the barrier material and the passivation layer which are in the groove.

14. The SOI chip according to claim 1 wherein the groove is defined by side walls and an open bottom, the SOI chip further comprising the passivation layer on the silicon layer and the side walls of the groove with the bottom of the groove devoid of the passivation layer.

15. The SOI chip according to claim 14 wherein the passivation layer is selected from the group consisting of silicon nitride, polysilicon, oxide, and nitride.

16. The SOI chip according to claim 14 further comprising a fill material deposited in the groove adjacent the passivation layer on the side walls of the groove and contacting the substrate through the open bottom of the groove.

17. The chip according to claim 16 wherein the fill material is polysilicon.

18. The SOI chip according to claim 17 wherein the polysilicon fill material is doped conductive, forming an electrical contact with the substrate.

19. The SOI chip according to claim 18 further comprising a metal contact extending from the doped conductive fill material and forming an electrical contact with substrate.

20. The SOI chip according to claim 1 wherein the groove has a width of about 1–2 microns.

21. A silicon-on-insulator (SOI) semiconductor chip comprising:
   a peripheral edge;
   a substrate;
   an oxide layer on the substrate;
   a silicon layer on the oxide layer;
   a passivation layer on the silicon layer;
   an active area including a gate located above the silicon layer, a gate metal contact located above and forming an electrical contact with the gate, and at least one metal contact located above and forming an electrical contact with the silicon layer;
   an isolation barrier, including a groove:
      (a) being disposed slightly inward of the peripheral edge of the chip,
      (b) extending through the silicon layer and through the oxide layer and partially into the substrate to prohibit impurities in the oxide layer outside the isolation barrier from diffusing into the oxide layer inside the isolation barrier, and
      (c) surrounding completely the active area of the chip;
   a barrier material located (I) over the passivation layer on the silicon layer, and (ii) in the groove, presenting an additional barrier to impurities in the oxide layer outside the groove from diffusing into the oxide layer inside the groove.

22. A silicon-on-insulator (SOI) semiconductor chip comprising:
   a peripheral edge;
   a substrate;
   an oxide layer on the substrate;
   a silicon layer on the oxide layer;
   a passivation layer on the silicon layer;
   an active area;
   an isolation barrier, including a groove:
      (a) being disposed slightly inward of the peripheral edge of the chip,
      (b) extending through the silicon layer and through the oxide layer and partially into the substrate to prohibit impurities in the oxide layer outside the isolation barrier from diffusing into the oxide layer inside the isolation barrier, and
      (c) surrounding completely the active area of the chip;
   a barrier material located:
      (a) over the passivation layer on the silicon layer, and
      (b) in the groove, presenting an additional barrier to impurities in the oxide layer outside the groove from diffusing into the oxide layer inside the groove.

23. The SOI chip according to claim 22 wherein the passivation layer is selected from the group consisting of silicon nitride, polysilicon, oxide, and nitride.

24. The SOI chip according to claim 22 wherein the barrier material is dielectric.

25. The SOI chip according to claim 24 wherein the barrier material is selected from the group consisting of phosphosilicate glass (PSG), BPSG, nitride and oxide that prevents impurities in said oxide layer outside said isolation barrier from diffusing into said oxide layer inside said isolation barrier.

26. The SOI chip according to claim 22 wherein the groove has a width of about 1–2 microns.

27. The SOI chip according to claim 22 wherein the groove in the isolation barrier extends through the passivation layer.

28. A silicon-on-insulator (SOI) semiconductor chip comprising:
   a peripheral edge;
   a substrate;
   an oxide layer on the substrate;
   a silicon layer on the oxide layer;
   an active area;
   an isolation barrier:
      (a) including a groove defined by side walls and an open bottom,
      (b) being disposed slightly inward of the peripheral edge of the chip,
      (c) extending through the silicon layer and through the oxide layer and partially into the substrate to prohibit impurities in the oxide layer outside the isolation barrier from diffusing into the oxide layer inside the isolation barrier, and
      (d) surrounding completely the active area of the chip;
   a passivation layer on the silicon layer and the side walls of the groove with the bottom of the groove devoid of the passivation layer;
   a doped conductive fill material located in the groove adjacent the passivation layer on the sidewalls of the groove forming an electrical contact with the substrate and contacting the substrate through the open bottom of the groove; and
   a metal contact extending from the doped conductive fill material and forming an electrical contact with the doped conductive fill material.

29. The SOI chip according to claim 28 wherein the passivation layer is selected from the group consisting of silicon nitride, polysilicon, oxide, and nitride.

30. The SOI chip according to claim 28 wherein the fill material is polysilicon.

31. The SOI chip according to claim 29 wherein the barrier material is polysilicon.

32. The SOI chip according to claim 31 wherein the barrier material is dielectric.

33. The SOI chip according to claim 32 wherein the barrier material is selected from the group consisting of phosphosilicate glass (PSG), BPSG, nitride and oxide that prevents impurities in said oxide layer outside said isolation barrier from diffusing into said oxide layer inside said isolation barrier.

34. The SOI chip according to claim 31 further comprising an oxide located in the groove and over the barrier material and the passivation layer which are in the groove.

35. The SOI chip according to claim 22 wherein the barrier material is conductive.

36. A silicon-on-insulator (SOI) semiconductor chip comprising:
   a peripheral edge;
   a substrate;
   an oxide layer on the substrate;
   a silicon layer on the oxide layer;
   an active area;
   an isolation barrier, including a groove:

(a) being disposed slightly inward of the peripheral edge of the chip,
(b) extending through the silicon layer and through the oxide layer and partially into the substrate to prohibit impurities in the oxide layer outside the isolation barrier from diffusing into the oxide layer inside the isolation barrier, and
(c) surrounding completely the active area of the chip;

a passivation layer on the silicon layer and in the groove; and a barrier material located in the passivation layer, over the silicon layer, and in the groove presenting an additional barrier to impurities in the oxide layer outside the groove from diffusing into the oxide layer inside the groove.

37. A silicon-on-insulator (SOI) semiconductor chip comprising:

a peripheral edge;

a substrate;

an oxide layer on the substrate;

a silicon layer on the oxide layer;

an active area;

an isolation barrier, including a groove:
(a) being disposed slightly inward of the peripheral edge of the chip,
(b) extending through the silicon layer and through the oxide layer and partially into the substrate to prohibit impurities in the oxide layer outside the isolation barrier from diffusing into the oxide layer inside the isolation barrier, and
(c) surrounding completely the active area of the chip.

38. A silicon-on-insulator (SOI) semiconductor chip comprising:

a peripheral edge;

a substrate;

an oxide layer on the substrate;

a silicon layer on the oxide layer;

an active area;

an isolation barrier, including a groove:
(a) being disposed slightly inward of the pheriphal edge of the chip,
(b) extending through the silicon layer and through the oxide layer and partially into the substrate to prohibit impurities in the oxide layer outside the isolation barrier from diffusing into the oxide layer inside the isolation barrier, and
(c) surrounding completely the active area of the chip; and a passivation layer on the silicon layer and extending to and partially over the groove.

* * * * *